United States Patent
Jain et al.

(10) Patent No.: US 11,158,722 B2
(45) Date of Patent: Oct. 26, 2021

(54) TRANSISTORS WITH LATTICE STRUCTURE

(71) Applicant: GLOBALFOUNDRIES U.S. INC., Santa Clara, CA (US)

(72) Inventors: Vibhor Jain, Essex Junction, VT (US); Steven M. Shank, Jericho, VT (US); John J. Pekarik, Underhill, VT (US); Anthony K. Stamper, Burlington, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 25 days.

(21) Appl. No.: 16/730,371

(22) Filed: Dec. 30, 2019

(65) Prior Publication Data

US 2021/0202717 A1   Jul. 1, 2021

(51) Int. Cl.
| | |
|---|---|
| *H01L 29/66* | (2006.01) |
| *H01L 21/762* | (2006.01) |
| *H01L 21/02* | (2006.01) |
| *H01L 29/15* | (2006.01) |
| *H01L 29/16* | (2006.01) |
| *H01L 29/267* | (2006.01) |
| *H01L 29/10* | (2006.01) |

(52) U.S. Cl.
CPC .... *H01L 29/66242* (2013.01); *H01L 21/0245* (2013.01); *H01L 21/76224* (2013.01); *H01L 21/76283* (2013.01); *H01L 29/1054* (2013.01); *H01L 29/155* (2013.01); *H01L 29/16* (2013.01); *H01L 29/267* (2013.01); *H01L 29/66318* (2013.01)

(58) Field of Classification Search
CPC .......... H01L 29/66242; H01L 29/1054; H01L 29/155; H01L 29/16; H01L 29/267; H01L 29/66318; H01L 21/0245; H01L 21/76224; H01L 21/76283
USPC ........................................................ 257/197
See application file for complete search history.

(56) References Cited

U.S. PATENT DOCUMENTS

| | | | |
|---|---|---|---|
| 7,144,787 B2 | 12/2006 | Dokumaci et al. | |
| 7,202,494 B2 | 4/2007 | Blanchard | |
| 7,279,701 B2 | 10/2007 | Kreps | |
| 7,433,729 B2 | 10/2008 | Setlak | |
| 7,439,558 B2 | 10/2008 | Enicks | |
| 7,446,002 B2 | 11/2008 | Mears | |
| 7,517,702 B2 | 4/2009 | Halilov | |
| 7,531,828 B2 | 5/2009 | Mears | |

(Continued)

OTHER PUBLICATIONS

Yuan et al., "Design and Optimization of Superjunction Collectors for Use in High-Speed SiGe HBTs", IEEE Transactions on Electron Devices, vol. 58 , Issue: 6 , Jun. 2011, 8 pages.

(Continued)

*Primary Examiner* — Calvin Y Choi
(74) *Attorney, Agent, or Firm* — David Cain; Andrew M. Calderon; Roberts Calderon Safran & Cole, P.C.

(57) ABSTRACT

The present disclosure relates to semiconductor structures and, more particularly, to transistors with an oxygen lattice structure and methods of manufacture. The structure includes: a sub-collector region in a substrate; a collector region above the substrate; at least one oxygen film separating the sub-collector region and the collector region; an emitter region adjacent to the collector region; and a base region adjacent to the emitter region.

18 Claims, 6 Drawing Sheets

(56) References Cited

U.S. PATENT DOCUMENTS

| | | |
|---|---|---|
| 7,531,829 B2 | 5/2009 | Blanchard |
| 7,535,041 B2 | 5/2009 | Blanchard |
| 7,598,515 B2 | 10/2009 | Mears |
| 7,781,827 B2 | 8/2010 | Rao |
| 8,866,154 B2 | 10/2014 | Ma et al. |
| 9,406,753 B2 | 8/2016 | Mears et al. |
| 9,899,479 B2 | 2/2018 | Mears et al. |
| 10,170,603 B2 | 1/2019 | Mears et al. |
| 2004/0266116 A1 | 12/2004 | Mears et al. |
| 2006/0220118 A1 | 10/2006 | Stephenson |
| 2006/0273299 A1 | 12/2006 | Stephenson |
| 2007/0015344 A1 | 1/2007 | Mears |
| 2008/0164494 A1* | 7/2008 | Pagette ............ H01L 29/66242 257/197 |
| 2018/0040743 A1 | 2/2018 | Mears |

OTHER PUBLICATIONS

Yamada et al., "Fabrication of Si/SiO2 Superlattice Microwire Array Solar Cells Using Microsphere Lithography", Journal of Nanomaterials, 2016, 9 pages.

Choi et al., "A Novel Isolation Scheme featuring Cavities in the Collector for a High-Speed 0.13μm SiGe:C BiCMOS Technology", IEEE, 2007, 4 pages.

Simoen et al., "Deep levels in silicon-oxygen superlattices", IOP Publishing Semiconductor Science and Technology, 2016, 8 pages.

Wier et al., "On the Use of Vertical Superjunction Collectors for Enhanced Breakdown Performance in SiGe HBTs", IEEE, 2016, 4 pages.

Miranda, "The Threat of Semiconductor Variability", IEEE Spectrum, Jun. 28, 2012, 6 pages.

\* cited by examiner

TRANSISTORS WITH LATTICE STRUCTURE

FIELD OF THE INVENTION

The present disclosure relates to semiconductor structures and, more particularly, to transistors with a silicon-oxygen lattice structure and methods of manufacture.

BACKGROUND

A heterojunction bipolar transistor (HBT) is a type of bipolar junction transistor (BJT) which uses differing semiconductor materials for the emitter and base regions or collector and base regions, creating a heterojunction. Si/SiGe HBTs are used in power amplifier applications and require low collector-base capacitance Ccb, high cut-off frequencies fT/fMAX and high breakdown voltage (BVceo)

Low cost integration schemes can include an implanted sub-collector region. This region, though, has high Ccb due to sub-collector diffusion into the collector and close to the surface. Ccb is a parasitic capacitance and high Ccb is a concern in bipolar technologies as it limits device scaling for improved fT/fMAX.

SUMMARY

In an aspect of the disclosure, a structure comprises: a sub-collector region in a substrate; a collector region above the substrate; at least one oxygen film separating the sub-collector region and the collector region; an emitter region adjacent to the collector region; and a base region adjacent to the emitter region.

In an aspect of the disclosure, a structure comprises: a bipolar device comprising an emitter, base, collector and sub-collector; and an oxygen film between the collector and the sub-collector.

In an aspect of the disclosure, a method comprises: forming a sub-collector region; forming a collector region; forming at least one oxygen film separating the sub-collector region and the collector region; forming an emitter region adjacent to the collector region; and forming a base region adjacent to the emitter region.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to transistors with a silicon-oxygen lattice structure and methods of manufacture. More specifically, the present disclosure relates to SiGe heterojunction bipolar transistors (HBT) with a silicon-oxygen lattice in the collector region. Advantageously, by implementing the silicon-oxygen lattice in the collector region it is possible to provide improved carrier mobility, lower collector base capacitance (Ccb) and reduced dopant diffusion in the collector region for improved performance, i.e., improved collector-emitter breakdown voltage, or BVCEO, or unity gain cut-off frequencies fT/fMAX.

In embodiments, a bipolar device (e.g., HBT) comprises a single crystal sub-collector and collector regions separated by at least one oxygen film. In embodiments, the film can be an oxygen-silicon super-lattice. In further embodiments, alternate p-n super junctions can be provided between the oxygen layers with the same or different dopant gradients. The silicon/oxygen super-lattice in the collector region of the HBT provides for improved breakdown voltage (BV) control. For example, having abrupt doping profiles with precise junctions allow device scaling with lower parasitic for improved performance.

The transistors of the present disclosure can be manufactured in a number of ways using a number of different tools. In general, though, the methodologies and tools are used to form structures with dimensions in the micrometer and nanometer scale. The methodologies, i.e., technologies, employed to manufacture the transistor of the present disclosure have been adopted from integrated circuit (IC) technology. For example, the structures are built on wafers and are realized in films of material patterned by photolithographic processes on the top of a wafer. In particular, the fabrication of the transistors uses three basic building blocks: (i) deposition of thin films of material on a substrate, (ii) applying a patterned mask on top of the films by photolithographic imaging, and (iii) etching the films selectively to the mask.

Figure 1:
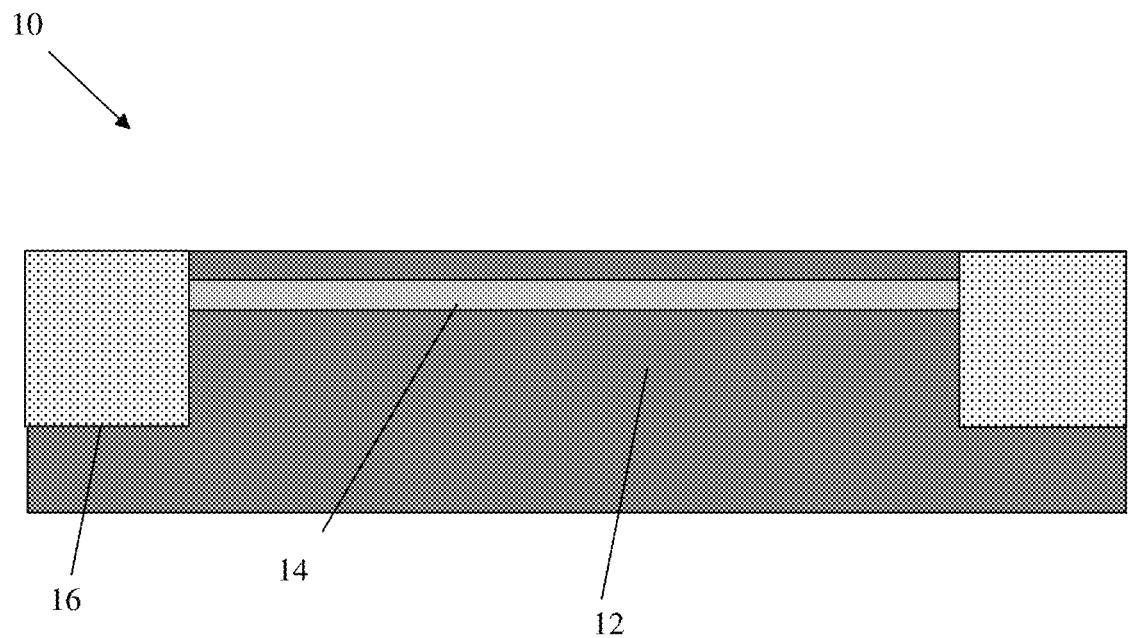
FIG. 1 shows a sub-collector implant, amongst other features, and respective fabrication processes in accordance with aspects of the present disclosure.

FIG. 1 shows a sub-collector implant, amongst other features, and respective fabrication processes in accordance with aspects of the present disclosure. More specifically, the structure 10 includes a lightly doped p-type substrate 12 composed of semiconductor material and, preferably, bulk Si material. In any of the embodiments, the substrate 12 may be composed of any suitable material including, but not limited to, Si (e.g., single crystalline Si), SiGe, SiGeC, SiC, GaAs, InAs, InP, and other III/V or II/VI compound semiconductors. In further embodiments, the substrate 12 may be silicon on insulator technology (SOI) which includes an insulator layer on top of the semiconductor layer and another semiconductor layer on top of the insulator layer. The insulator is formed by any suitable process such as separation by implantation of oxygen (SIMOX), oxidation, deposition, and/or other suitable process. The semiconductor layer on top of the insulator layer can be fabricated using wafer bonding, and/or other suitable methods.

Still referring to FIG. 1, a sub-collector region 14 is formed within the substrate 12 by a doping process, e.g., ion implantation. The sub-collector region 14 can be a highly doped n-type region, i.e., phosphorus or arsenic, formed by ion implantation processes or other known diffusion processes such that no further explanation is required herein for a complete understanding of the present disclosure. Also, the combination of the highly doped n-type sub-collector region 14 with the p-type substrate 12 will result in an PNP transistor; however, it is contemplated herein that the sub-collector 14 can be a highly doped p-type and the substrate 12 can be a lightly doped n-type, thereby forming a NPN transistor.

FIG. 1 further shows shallow trench isolation regions 16 formed through the substrate 12, isolating the sub-collector region 14. The shallow trench isolation regions 16 can be formed by conventional lithography, etching and deposition methods known to those of skill in the art. For example, a resist formed over the substrate 12 is exposed to energy (light) to form a pattern (opening). An etching process with a selective chemistry, e.g., reactive ion etching (RIE), will be used to form one or more trenches in the substrate 12 through the openings of the resist. The resist can then be removed by a conventional oxygen ashing process or other known stripants. Following the resist removal, insulator material (e.g., oxide material) can be deposited by any conventional deposition processes, e.g., chemical vapor deposition (CVD) processes. Any residual insulator material on the surface of the substrate 12 can be removed by conventional chemical mechanical polishing (CMP) processes.

Figure 2:
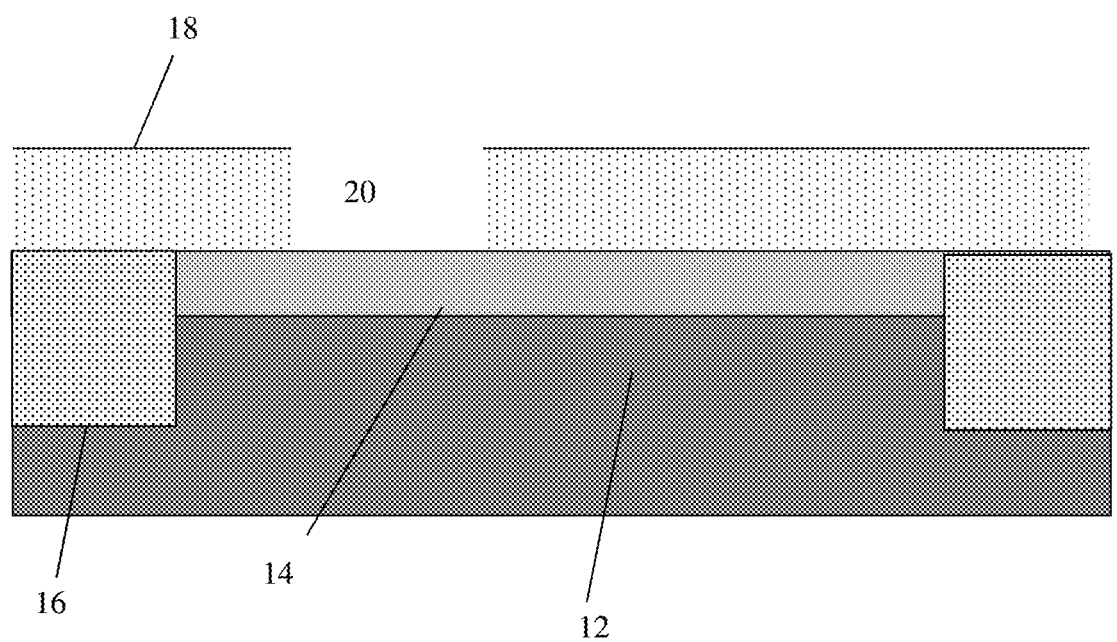
FIG. 2 shows an oxide material with an opening over the sub-collector region, amongst other features, and respective fabrication processes in accordance with aspects of the present disclosure.

In FIG. 2, an oxide material 18 is formed over the substrate 12 and, more specifically, over the sub-collector region 14. In embodiments, the oxide material 18 can be a high temperature oxide (e.g., TEOS) deposited or grown using conventional processes such that no further explanation is required for a complete understanding of the present disclosure. In alternate embodiments, the oxide material 18 is a deposited oxide material using a conventional CVD process. In embodiments, the oxide material 18 can have a thickness of about 100 Å to 2000 Å; although other dimensions are also contemplated herein. An opening 20 is formed in the oxide material 18 to accommodate a yet to be formed collector region. The opening 20 is formed by conventional lithography and etching processes as already described herein.

As should be understood by those skill in the art, the n-type dopants of the sub-collector region 14 will significantly diffuse further into the substrate 12 during the above noted thermal processing steps. That is, the n-type dopants of the sub-collector 14 will diffuse to a surface of the substrate 12 due to thermal steps associated with BiCMOS integration, i.e., the n-type dopants (e.g., P or As) will diffuse to the surface of the substrate 12 due to thermal budget. The diffusion of the n-type dopants to a surface of the substrate 12 can increase Ccb. Also, as should be understood by those of ordinary skill in the art, the n-type dopant can lower the collector region resistance with known transistor configurations.

Figure 3A:
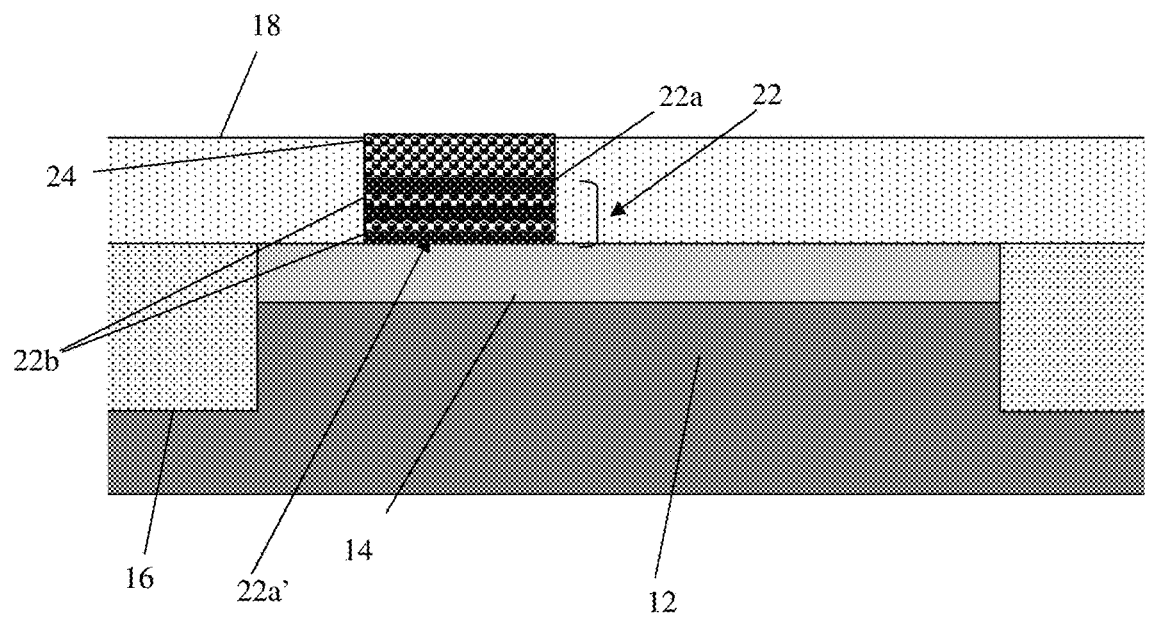
FIG. 3A shows a collector region, amongst other features, and respective fabrication processes in accordance with aspects of the present disclosure.

FIG. 3A shows a collector region 22, amongst other features, and respective fabrication processes in accordance with aspects of the present disclosure. More specifically, the collector region 22 includes a silicon oxygen super-lattice composed of alternating layers (films) of oxygen material 22a and silicon material (e.g., single crystalline Si material) 22b formed within the opening 20 of the oxide material 18. The silicon oxygen super-lattice 22a, 22b is formed by a selective silicon growth process within the opening 20 using an atomic layer of oxygen deposited in an atomic layer deposition (ALD) tool followed by silicon growth or deposition in a CVD tool. Both the tools could be connected in-situ using a low pressure (vacuum) transfer chamber. The wafers can be transferred back and forth between the two tools without breaking vacuum for a good quality film growth.

Still referring to FIG. 3A, in embodiments, the first layer of oxygen material 22a' is deposited directly on a surface of the substrate 12 followed by alternating layers of silicon material 22b (or other semiconductor materials described herein) and oxygen material 22a and capped by a semiconductor material 24 (which forms part of the intrinsic base). It should be recognized by those of ordinary skill that the first layer of oxygen material 22a' at the junction of the collector region 22 will significantly reduce n-type dopants from diffusing into the collector region 22, e.g., into the silicon material (or other semiconductor material) due to the thermal budget associated with the above and subsequent processing steps. In embodiments, the first layer of oxide material 22a', e.g., at the interface of the substrate 12, can be a monolayer or sub-monolayer of oxide with a thickness of 5 Å or less; although other dimensions are also contemplated herein. Although two layers of oxygen material and semiconductor material are shown, any number of alternating layers are contemplated herein.

In further embodiments, the layers of silicon material 22b between the oxygen material 22a can be undoped or have alternate p-n doping to form a "super-junction" collector region 22. In still further embodiments, the layers of silicon material 22b can have the same doping type at each level, different doping types at different/same levels, or a gradient at each layer or any combination thereof, thereby enabling improved device performance. For example, the doping of the silicon material 22b can be a n-type doping or p-doping or both with different doping concentrations as needed to optimize the capacitance and breakdown voltage of the transistor. In embodiments, a gradient can be formed by different doping concentration, e.g., 1e17 in a top portion and 1e17 to 1e21 in the lower portion of each layer of material 22b. In still further embodiments, the material 22b can be other semiconductor materials, e.g., SiGe or alternating layers of SiGe and single crystalline Si with the same or different dopant profiles and/or with graduated or constant doping levels. For example, the layers of the material 22b can contain Ge, e.g., 5%-25% Ge material.

Figure 3B:
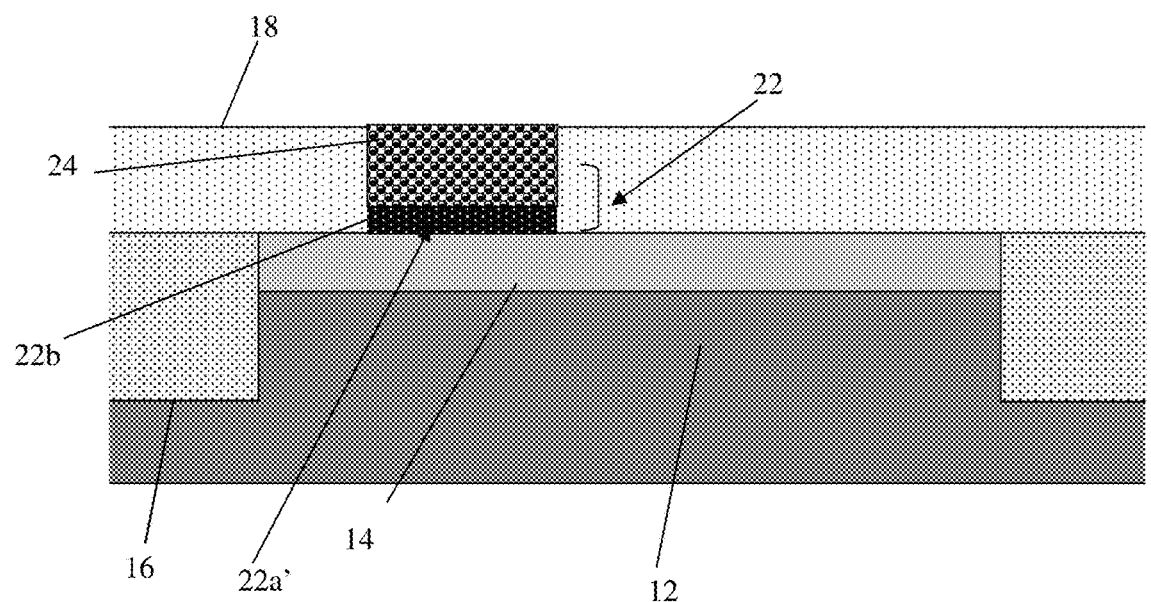
FIG. 3B shows an alternative collector region, amongst other features, and respective fabrication processes in accordance with aspects of the present disclosure.

FIG. 3B shows an alternative collector region in accordance with aspects of the present disclosure. In this configuration, there is a single layer of oxygen material 22a' at the junction of the collector region 22 and a surface of the substrate 12 (e.g., diffusion profile) which, again, will significantly reduce dopants from diffusing into the collector region 22, e.g., silicon material (or other semiconductor material). In embodiments, the first layer of oxide material 22a', e.g., at the interface of the substrate 12, is a monolayer or sub-monolayer of oxide with a thickness of 5 Å or less; although other dimensions are also contemplated herein. As a still further alternate embodiment, the layer of oxygen material 22a' can be deposited anywhere in the selective collector region 22 for Bvceo/Bvcbo control. In any scenario, a layer of silicon material 24 is deposited on the oxygen material 22a to form the intrinsic base.

Figure 4:
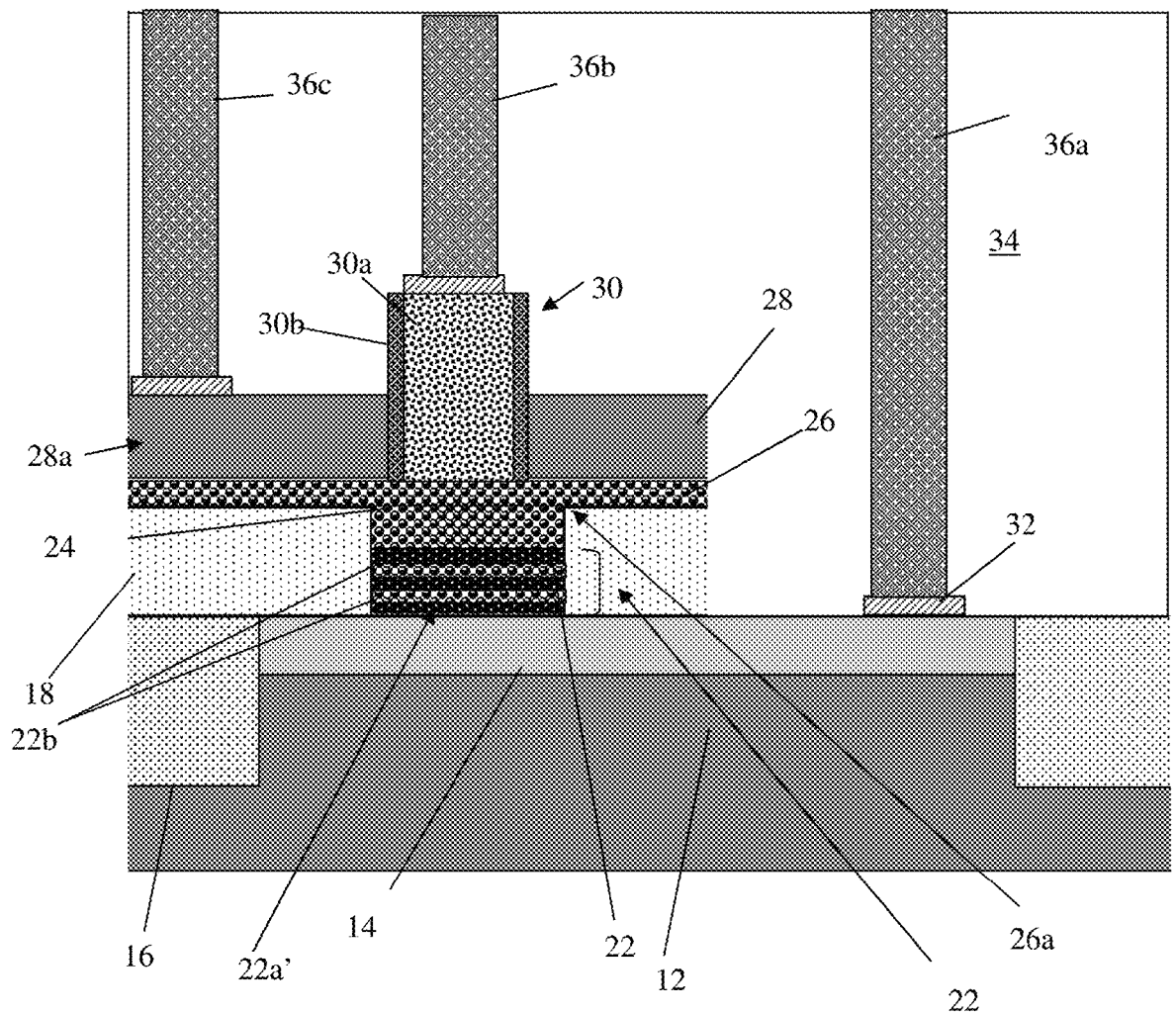
FIG. 4 shows an emitter region and extrinsic base region, amongst other features, and respective fabrication processes in accordance with aspects of the present disclosure.

FIG. 4 shows an emitter region 30 and extrinsic base region 28a, amongst other features, and respective fabrication processes in accordance with aspects of the present disclosure. More specifically, a semiconductor material 26 is formed on the oxide material 18 and collector region 22. In embodiments, the semiconductor material 26 will form part of the intrinsic base 26a, directly over and adjacent to the collector region 22. In embodiments, the semiconductor layer 26 can be composed of multiple layers such as single crystalline Si, single crystalline SiGe, followed by Ge, carbon (C) and/or boron (B), and completed with a layer of a single crystalline Si material, as one illustrative non-limiting example. The semiconductor layer 26 can be formed by conventional epitaxial growth processes.

An additional layer of semiconductor material 28 is formed over the semiconductor material 26. In embodiments, the semiconductor material 28 will form part of the extrinsic base region 28a. The semiconductor material 28 can be, e.g., SiGe, Si or other semiconductor material. It should be noted that the substrate 26 will grow single crystal over the collector region 22 (layer 26a) and poly-crystalline over the oxide material.

Still referring to FIG. 4, an emitter region 30 is formed on the collector region 22, in direct contact with the intrinsic base 26a. The emitter region 30 is composed of polysilicon material 30a, with sidewalls 30b. In certain embodiments, the emitter region 30 can include other material 30a, e.g., single crystal silicon and may be SiGe. In embodiments, the material is n+ doped to form a low resistance emitter. The sidewalls 30b can be a single sidewall material or multiple sidewall materials, e.g., oxide and/or nitrogen. The emitter region 30 is formed using conventional lithography, etching and deposition processes such that no further explanation is required herein for a complete understanding of the present disclosure.

The semiconductor materials 26, 28 are patterned using conventional lithography and etching processes, to open or expose the sub-collector region 14 of the substrate 12, e.g., which is electrically contacting the collector region 22. Prior to contact formation, silicide contacts 32 are formed in contact with the collector region 22, e.g., sub-collector region 14, emitter region 30 and the extrinsic base region 28a. As should be understood by those of skill in the art, the silicide process begins with deposition of a thin transition metal layer, e.g., nickel, cobalt or titanium, over fully formed and patterned semiconductor materials. After deposition of the material, the structure is heated allowing the transition metal to react with exposed silicon (or other semiconductor material as described herein) forming a low-resistance transition metal silicide contacts 32. Following the reaction, any remaining transition metal is removed by chemical etching, leaving silicide contacts 32.

A dielectric material 34 is deposited over the structure, e.g., sub-collector region 14, emitter region 30 and the extrinsic base region 28a, followed by a lithography, etching and deposition processes (e.g., metallization process). For example, the dielectric material 34 is deposited by a CVD process, followed by the lithography and etching (e.g., RIE) process to form trenches with in the dielectric material 34. A metal material, e.g., aluminum or tungsten, is deposited within the trenches to form the contacts, e.g., collector contact 36a, emitter contact 36b and extrinsic base contact 36c.

Figure 5:
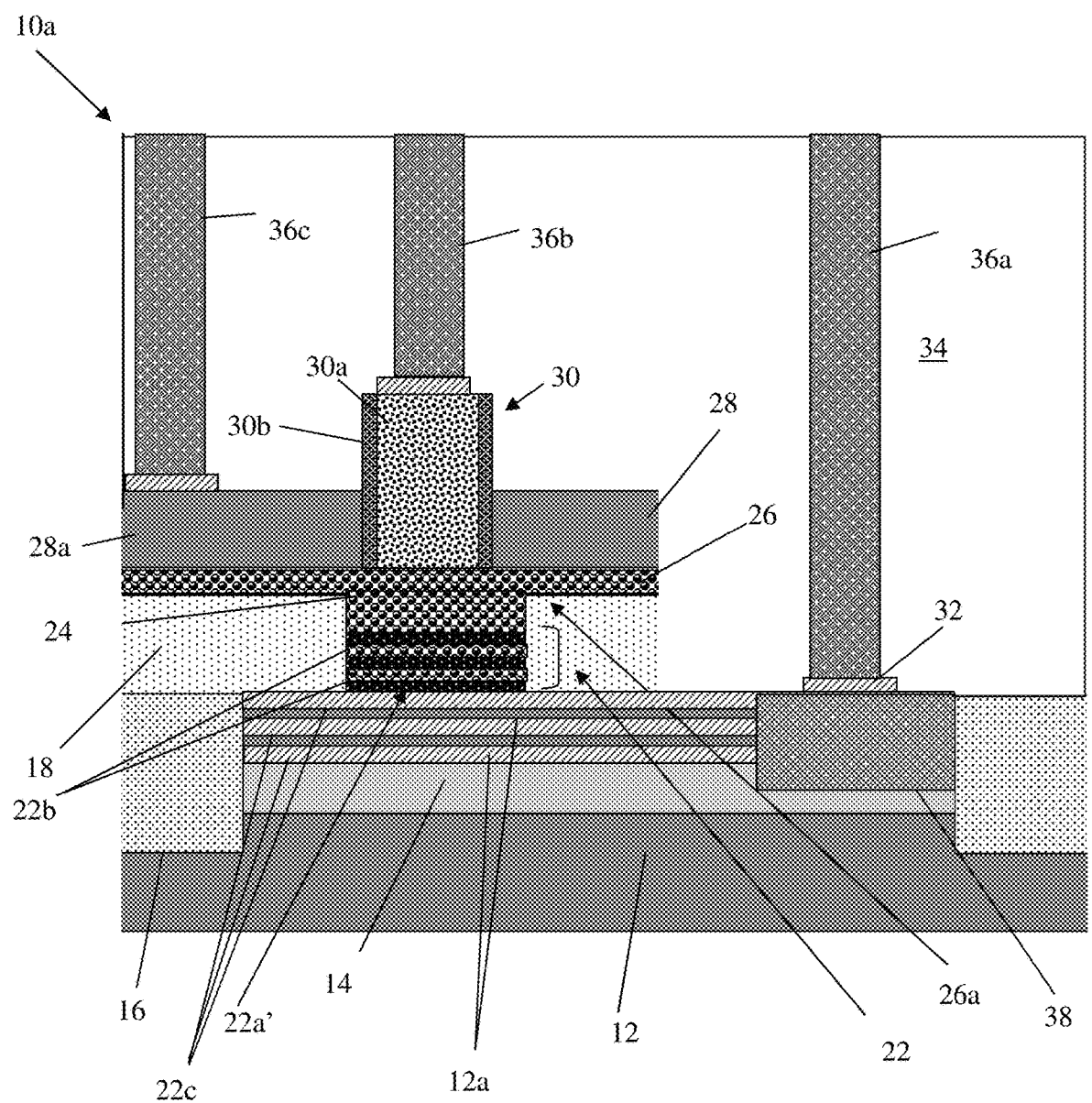
FIG. 5 shows a heterojunction bipolar transistor with multiple layers of oxygen and semiconductor material within the sub-collector region and respective fabrication processes in accordance with alternative aspects of the present disclosure.

FIG. 5 shows a heterojunction bipolar transistor 10a and respective fabrication processes in accordance with alternative aspects of the present disclosure. In this structure 10a, a non-selective growth of alternating layers of oxygen material 22c and silicon material 12a are formed in a super-lattice within the sub-collector region 14 (e.g., above the implanted sub-collector region 14). In this embodiment, the layers of oxygen material 22c and semiconductor material 12a are deposited or grown prior to the formation of the shallow trench isolation structures 16 (as shown in FIG. 1).

In the alternative embodiment of FIG. 5, the oxygen material 22c will prevent the out-diffusion of the dopants of the sub-collector region 14 from reaching the collector region 22 during subsequent thermal processes. Also, as noted above, the silicon material 12a can be (i) undoped, (ii) alternate with p-n doping, (iii) include the same doping concentration at each level, (iv) include different doping concentrations at different/same levels, or (v) include a gradient concentration at each layer or any combination thereof. The silicon material 22c can also include Ge material, e.g., 5-25% Ge material. A reach through 38 can be formed to the sub-collector region 14, which provides an electrical connection between the collector region 22 and the collector contact 36a. In embodiments, the reach through 38 can be provided by an ion implant process or other dopant process. The processes continue with those shown, e.g., in FIG. 3A.

Figure 6:
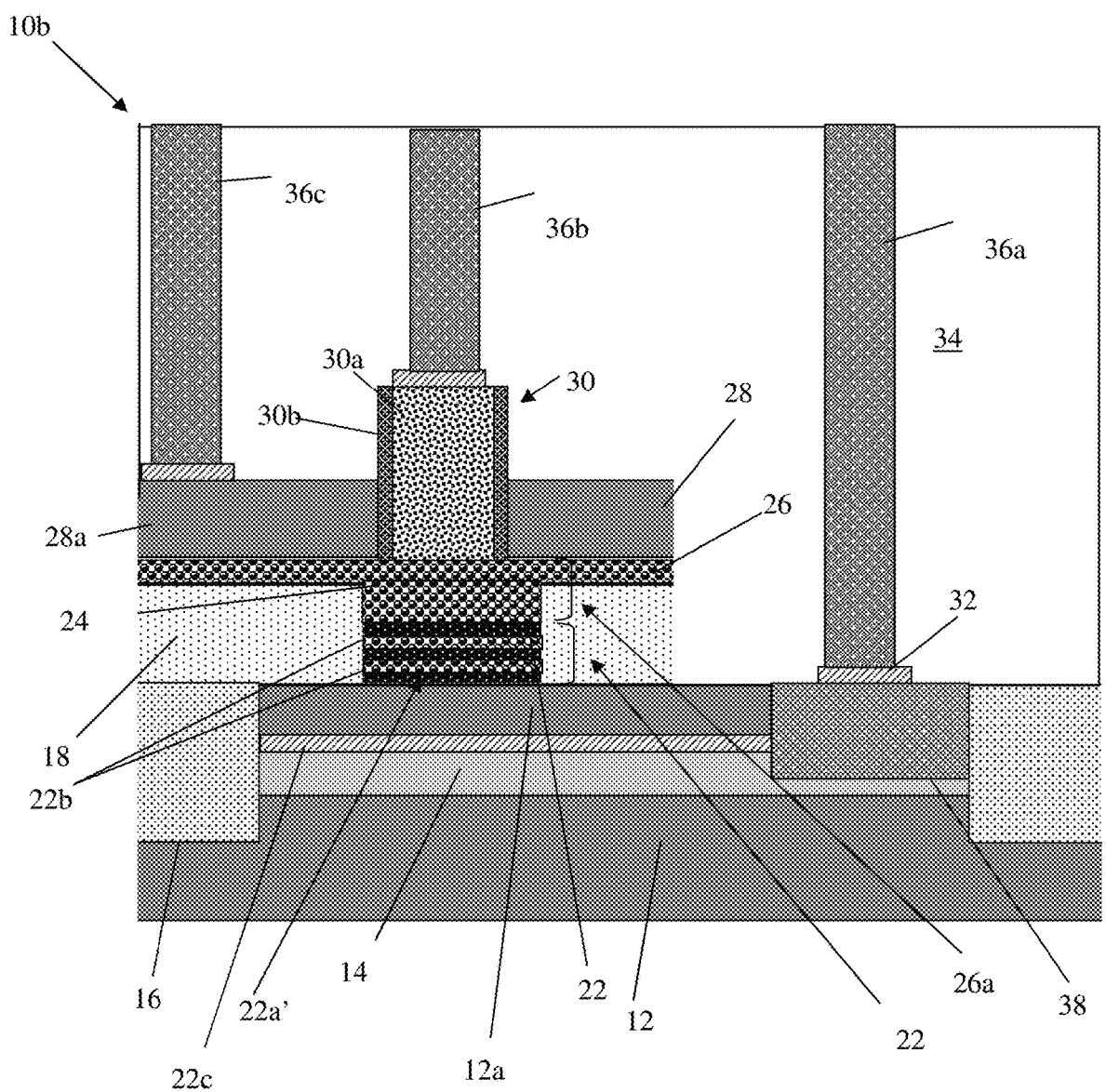
FIG. 6 shows a heterojunction bipolar transistor with a single layer of oxygen within the sub-collector region and respective fabrication processes in accordance with alternative aspects of the present disclosure.

FIG. 6 shows a heterojunction bipolar transistor 10b with a single layer of oxygen material 22c within the sub-collector region 14. In this embodiment, the single layer of oxygen material 22c and any semiconductor material deposited thereon is provided prior to the formation of the shallow trench isolation structures 16. As already described and as should now be understood by those of skill in the art, the oxygen material 22c will be above the dopant and will prevent the dopant in the sub-collector region 14 from reaching a surface of the substrate 12, e.g., reaching the interface between the substrate 12 and the collector region 22. The reach through 38 is formed to the sub-collector region 14 providing electrical connection with the collector region 22 and contact 36a. The processes continue with those shown, e.g., in FIG. 3A.

Figure 7:
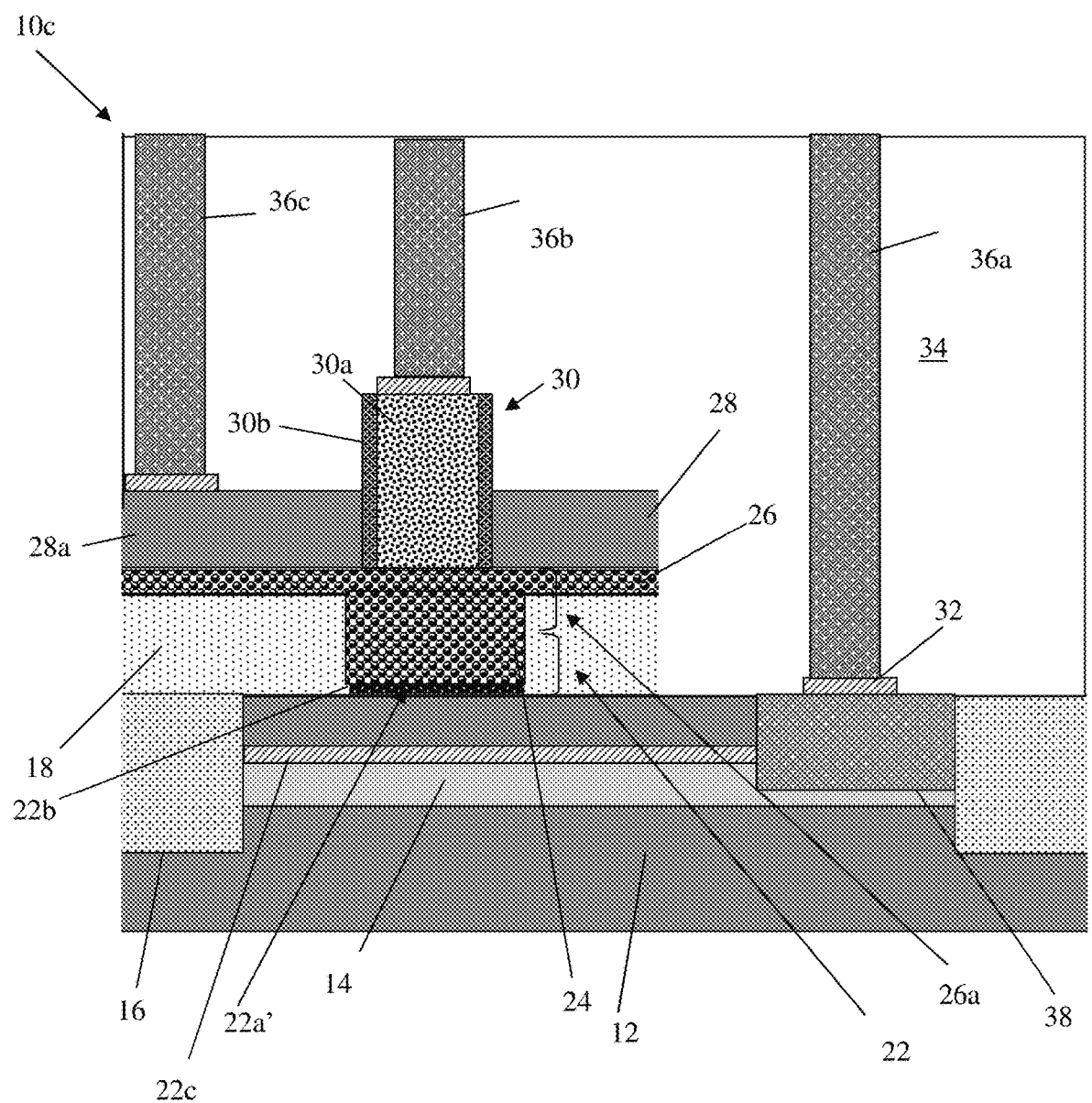
FIG. 7 shows a heterojunction bipolar transistor with a single layer of oxygen in the sub-collector region and collector region, and respective fabrication processes in accordance with alternative aspects of the present disclosure.

FIG. 7 shows a heterojunction bipolar transistor 10c with a single layer of oxygen material 22c within the sub-collector region 14 and a single layer of oxygen material 22a' in the collector region 22 (e.g., opening of the oxide material 18. In embodiment, the oxygen material 22c, 22a' will prevent the dopants in the sub-collector region 14 from reaching the interface between the substrate 12 and the collector region 22. The reach through 38 can be formed to the sub-collector region 14 providing electrical connection with the collector region 22 and contact 36a. In embodiments, the reach through 38 can be an ion implantation or other dopant process. The processes continue with those shown, e.g., in FIG. 3B.

The transistors can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a sub-collector region in a substrate;
   a collector region above the substrate;
   at least one oxygen film separating the sub-collector region and the collector region;
   an emitter region adjacent to the collector region; and
   a base region adjacent to the emitter region,
   wherein the at least one oxygen film is a monolayer or sub-monolayer of oxide.
2. The structure of claim 1, wherein the at least one oxygen film is in the collector region, at an interface with the sub-collector region.
3. The structure of claim 1, wherein the at least one oxygen film is in the sub-collector region.
4. The structure of claim 3, wherein the at least one oxygen film is a single layer of oxygen film separating the sub-collector region from the collector region.
5. The structure of claim 3, wherein the at least one oxygen film is multiple layers of oxygen film separating and alternating with multiple layers of semiconductor material in the sub-collector region, adjacent to the collector region.
6. The structure of claim 5, wherein the multiple layers of semiconductor material and the multiple layers of oxygen film are an oxygen-silicon super-lattice.
7. The structure of claim 5, wherein the multiple layers of semiconductor material have alternating dopant types at different levels.
8. The structure of claim 5, wherein the multiple layers of semiconductor material have different dopant concentrations.
9. The structure of claim 3, further comprising a reach through which passes through the at least one oxygen film to the sub-collector region.
10. The structure of claim 1, wherein the at least one oxygen film is multiple layers of oxygen film separating and alternating with multiple layers of semiconductor material in the collector region, adjacent to an intrinsic base and the sub-collector region.
11. The structure of claim 10, wherein the multiple layers of semiconductor material and the multiple layers of oxygen film are an oxygen-silicon super-lattice.
12. The structure of claim 10, wherein the multiple layers of semiconductor material have alternating dopant types on different levels.
13. A structure comprising:
    a bipolar device comprising an emitter, base, collector and sub-collector; and
    an oxygen film between the collector and the sub-collector,
    wherein the oxygen film is a monolayer or sub-monolayer of oxide in the sub-collector, collector or a combination of the sub-collector and the collector.
14. The structure of claim 13, further comprising multiple layers of oxygen film alternating with multiple layers of semiconductor material forming an oxygen-silicon super-lattice in the sub-collector, collector or both the sub-collector and collector.
15. The structure of claim 14, wherein the multiple layers of semiconductor material have alternating dopant types at different levels.
16. The structure of claim 14, wherein the at least one of the multiple layers of semiconductor material have a gradient dopant concentration.
17. The structure of claim 14, wherein the multiple layers of semiconductor material is SiGe.
18. A method comprising:
    forming a sub-collector region;
    forming a collector region;
    forming at least one oxygen film separating the sub-collector region and the collector region, wherein the at least one oxygen film is a monolayer or sub-monolayer of oxide;
    forming an emitter region adjacent to the collector region; and
    forming a base region adjacent to the emitter region.

* * * * *